United States Patent
Fink

(10) Patent No.: US 7,163,603 B2
(45) Date of Patent: Jan. 16, 2007

(54) PLASMA SOURCE ASSEMBLY AND METHOD OF MANUFACTURE

(75) Inventor: Steven T. Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 287 days.

(21) Appl. No.: 10/601,590

(22) Filed: Jun. 24, 2003

(65) Prior Publication Data

US 2004/0084153 A1    May 6, 2004

Related U.S. Application Data

(60) Provisional application No. 60/390,361, filed on Jun. 24, 2002.

(51) Int. Cl.
*H01L 21/306* (2006.01)
*C23C 16/00* (2006.01)

(52) U.S. Cl. .............................. 156/345.48; 118/723 I

(58) Field of Classification Search ............. 118/723 I, 118/723 IR, 723 AN; 156/345.48, 345.49; 315/111.51
See application file for complete search history.

(56) References Cited

U.S. PATENT DOCUMENTS 4,431,901 A * 2/1984 Hull ...................... 219/121.52
5,304,282 A * 4/1994 Flamm ......................... 216/68
5,405,480 A * 4/1995 Benzing et al. ......... 156/345.48
5,560,844 A * 10/1996 Boulos et al. .......... 219/121.59
5,584,971 A * 12/1996 Komino .................. 204/192.13
5,680,014 A * 10/1997 Miyamoto et al. ....... 315/111.41
5,681,418 A * 10/1997 Ishimaru ................. 156/345.37
6,245,202 B1 * 6/2001 Edamura et al. ........ 204/298.06

FOREIGN PATENT DOCUMENTS

WO    97-39607    * 10/1997

* cited by examiner

*Primary Examiner*—Luz Alejandro-Mulero
(74) *Attorney, Agent, or Firm*—Oblon, Spivak, McClelland, Maier & Neustadt, P.C.

(57) ABSTRACT

A plasma source assembly including an outer shield, a dielectric chamber wall, and a helical coil provided between the outer shield and the dielectric chamber wall. The plasma source assembly also includes a coil support assembly configured to facilitate repeatable performance of the helical coil. Preferably, the assembly includes a plenum cooling plate that is configured to supply cooling fluid to a first cooling rod provided within a resonator cavity defined by the chamber wall and the outer shield, and receive cooling fluid from a second cooling rod provided within the resonator cavity. The assembly preferably also includes a spacer provided between the first cooling rod and the second cooling rod, and coil insulators having holes configured to receive the helical coil.

17 Claims, 5 Drawing Sheets

PLASMA SOURCE ASSEMBLY AND METHOD OF MANUFACTURE

CROSS-REFERENCE TO RELATED APPLICATIONS

The present application is a utility application claiming priority to Provisional Application Ser. No. 60/390,361, which is related to pending U.S. application Ser. No. 60/291,337, filed on May 17, 2001, and pending U.S. patent application Ser. No. 09/774,182, filed on Feb. 5, 2001. The contents of those applications are incorporated herein by reference.

BACKGROUND OF THE INVENTION

1. Field of the Invention

The present invention relates to manufacturing of semiconductor integrated circuits.

2. Discussion of the Background

Manufacturers of semiconductor integrated circuits are faced with intense competitive pressure to improve their products and processes used to fabricate the products. The manufacturers have a large business motivation to lower production costs by improving product throughput, quality and complexity. Additionally, manufacturers have a need for repeatability and consistency in the assembly and functioning of semiconductor fabrication equipment. Accordingly, semiconductor manufacturers strive to formulate a low cost way to manufacture high quality process equipment.

One goal of semiconductor manufacturers is to improve tool performance at a low cost. Another goal is to make process equipment function the same regardless of particular hardware sampled. The company that can enhance tool performance without increasing tool cost is in a position to increase profit margins. In cyclical industries such as the semiconductor capital equipment industry, increased profit margins can have a dramatic impact on market penetration.

For many years Inductively Coupled Plasma (ICP) sources have been used in a variety of applications. Most recently, low pressure (<100 mTorr) ICP sources have been used in wafer production where plasmas are required to deliver high densities of ions, electrons and radicals with high uniformity over wafer diameters of 200 mm and larger. These plasma sources need to deliver ions that are uniform in density and energy distribution while keeping ion and electron energy very low.

The Electrostatically Shielded Radio Frequency (ESRF) plasma source is a type of ICP source which is particularly useful in applications where substrate materials are susceptible to damage from high energy plasma ions or electrons, uncontrolled bias voltages and thermal fluxes. ESRF sources feature pure inductive coupling with reduced capacitive coupling. The radio frequency (RF) power produces only plasma density and induces very little voltage on the plasma. This inductive coupling is sufficiently devoid of capacitive coupling so that the plasma does not search for counter electrodes. The plasma remains mainly within the process (dielectric) chamber at all powers and pressures.

The main components of an ESRF ICP processing system are depicted in the generic FIG. 1. The ESRF ICP processing system 10 includes a process chamber 20 with a wafer and chuck assembly 30 provided therein. A gas inject assembly 40 is provided opposite the wafer and chuck assembly 30. A plasma region or area 22 is provided adjacent a dielectric chamber wall 60 in between the wafer and chuck assembly 30 and the gas inject assembly 40.

The plasma source is composed of several main elements and is affixed to an opening of a suitable process chamber 20. A wafer that is being processed is located on the chuck assembly 30. The plasma source comprises a resonator chamber or cavity 72 bounded by an outer shield or housing 50 and the dielectric chamber wall 60, within which a helical coil 90 is mounted. The outer shield 50 and the dielectric chamber wall 60 further define a fluid cooling area 70, within which the helical coil 90 is immersed. The dielectric chamber wall 60 contains the plasma area 22 of the plasma source. Furthermore, the dielectric chamber wall 60 has appropriate sealing devices to seal cooling fluid within fluid cooling area 70 and maintain the process pressure within plasma area 22 at appropriate levels. Additionally, an electrostatic shield 80 is provided on an outer surface of the dielectric chamber wall 60 in an interior of the fluid cooling area 70.

In the construction of ESRF source assemblies, there are several elements that are expensive to fabricate for various reasons. The outer shield or housing can be the most expensive part in the source. It can be fabricated from several aluminum parts and subsequently furnace or dip brazed to form a singular assembly. The interface of these parts must be machined to tolerances required in the brazing process. Once machined, the parts are then assembled utilizing an appropriate holding fixture and brazed using the specified processes. Various machining operations must then be performed on the resulting brazed assembly before it is ready for use.

Another problem seen in ESRF plasma sources is the method and repeatability of mounting the helical coil. In ESRF plasma sources, particularly those sources comprising a quarter-wave or half-wave resonant coil, the coil is tuned to a particular frequency. In order to tune the helical coil to a particular frequency, a labor intensive process of adjusting the length of the coil is involved. Once the coil is tuned, changes in coil position can adversely affect the tuning.

SUMMARY OF THE INVENTION

The present invention advantageously provides a plasma source assembly including an outer shield, a dielectric chamber wall, and a helical coil. The helical coil is advantageously mounted within a cavity bounded by the outer shield and the dielectric chamber wall.

It is an object of the invention to produce the outer shield (housing) in a very cost effective manner that requires no special processes or machining after original fabrication of the parts. Such a source assembly configuration may allow quick changes and modifications to the outer shield housing and electrostatic shield using many original parts, without other special processes or special tools.

In the preferred embodiment of the present invention, the plasma source assembly further includes an electrostatic shield provided outside the dielectric chamber wall, forming an interior of the cavity. The plasma source assembly preferably includes a plenum cooling plate defining a manifold configured to supply cooling fluid to the cavity and a gas inject assembly attachable to the outer shield.

The plasma source assembly preferably includes structure for stacking and detachably joining a plurality of plates to form the outer shield, and structure for constructing the gas inject assembly and the dielectric chamber wall to be removable from the plasma source assembly without using a tool. The preferred embodiment of the present invention includes structure for circulating cooling fluid throughout the cavity and the gas inject assembly, and structure for removing bubbles from the cooling fluid within the cavity.

It is another object of the present invention to provide a coil support assembly and method that supports, separates, and holds the helical coil in such manner that the plasma source only needs to be tuned once. Such a manufacturing method makes helical coil tuning repeatable even after complete disassembly and subsequent reassembly of the entire plasma source assembly.

It is a further object to circulate cooling fluid throughout the plasma source and the gas inject assembly in a way that promotes efficient cooling, and also removes and discourages the forming of any bubbles in the cooling fluid. Air bubbles, especially bubbles located inside the resonator cavity, degrade the insulating properties of the dielectric cooling fluid. Maintenance and cleaning are needed to ensure that acceptable process conditions are met. One aspect of maintenance and cleaning is the removal of the dielectric chamber wall for wet cleaning. A goal of maintenance and cleaning operations is short machine downtime. Thus, preferably the dielectric chamber wall (process tube) may be removed and the inject assembly may be removed and/or replaced for maintenance purposes quickly without using tools.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE INVENTION

Figure 1:
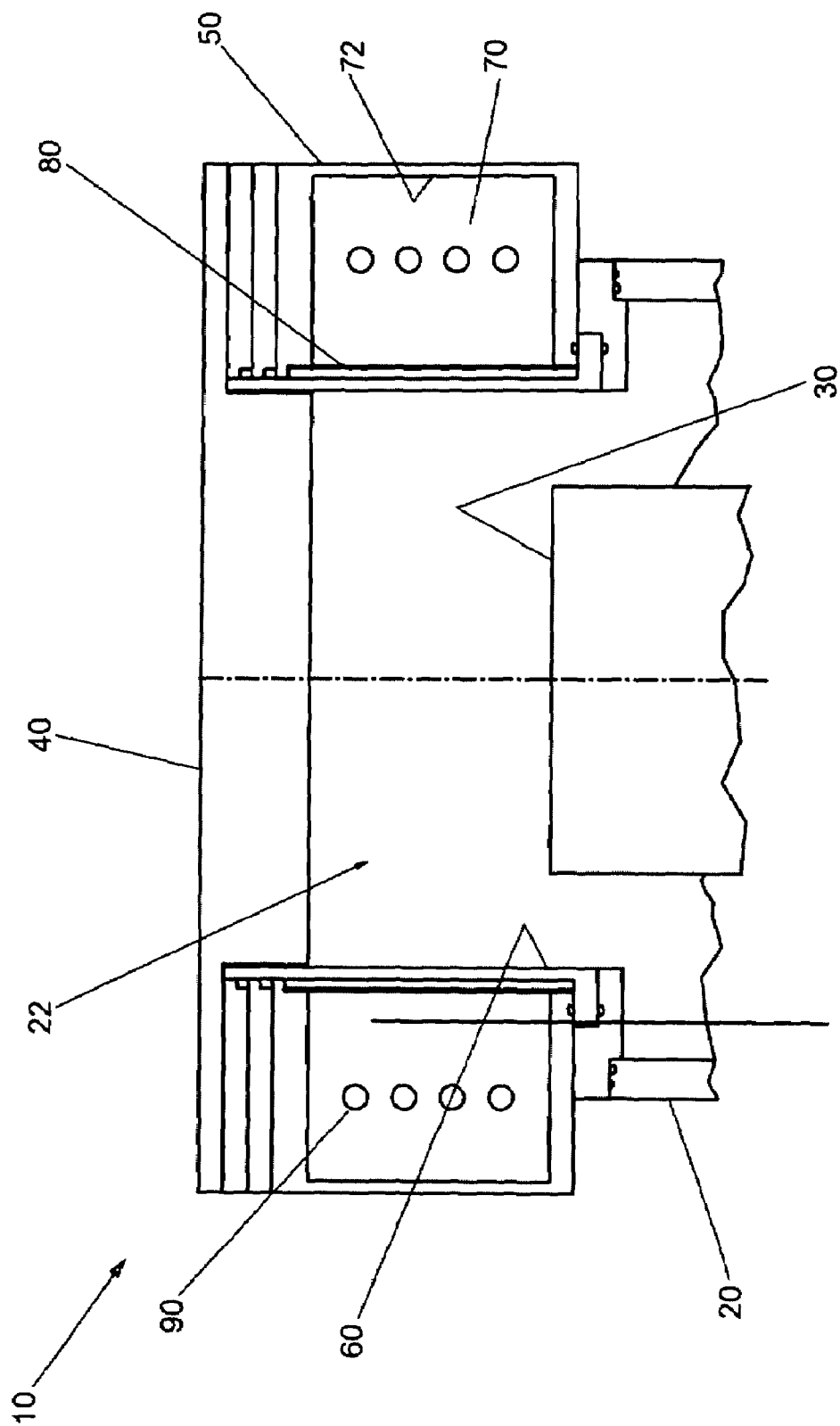
FIG. 1 is a general section view of an electrostatically shielded radio frequency (ESRF) inductively coupled plasma (ICP) source.
Figure 2:
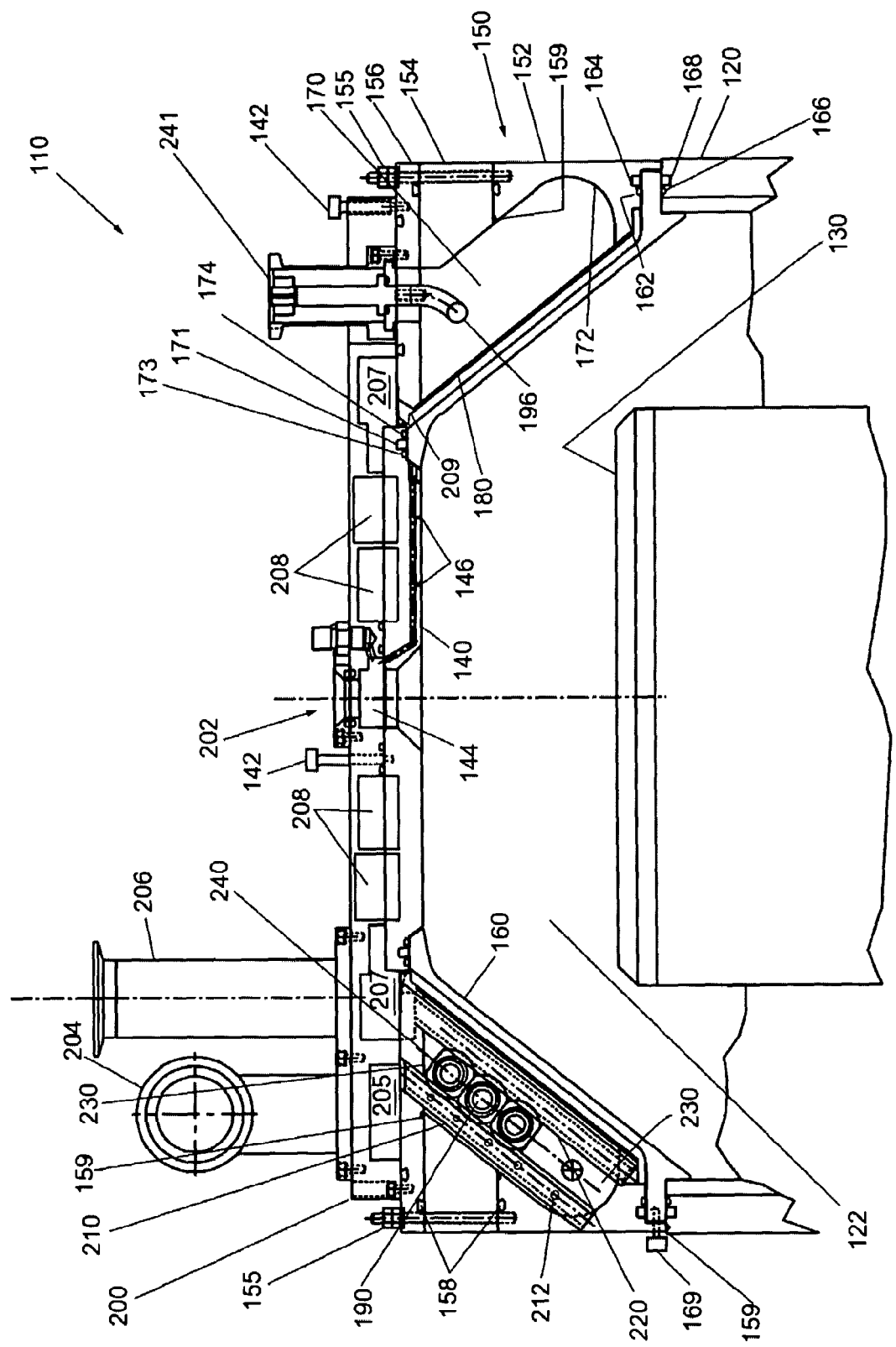
FIG. 2 is a section view of an ESRF ICP source according to the present invention.

FIG. 2 is a section view of an ESRF ICP source according to one embodiment of the present invention. The present invention provides an inexpensive, dielectric fluid cooled, efficient, ESRF ICP plasma source that can easily be modified, remains tuned to a particular frequency, and can easily and quickly be cleaned.

FIG. 2 depicts an ESRF ICP plasma source assembly 110 that generally includes a process chamber 120 with a wafer and chuck assembly 130 provided therein. A gas inject assembly 140 is provided opposite the wafer and chuck assembly 130. A plasma region or area 122 is provided adjacent a dielectric chamber wall 160 in between the wafer and chuck assembly 130 and the gas inject assembly 140. An outer shield or housing 150 is mounted between the process chamber 120 and the gas inject assembly 140. The outer shield 150 and the dielectric chamber wall 160 define a resonator cavity 172 that bounds a fluid cooling area 170. An electrostatic shield 180 is provided outside the dielectric chamber wall 160 forming an interior wall in the fluid cooling area 170. A coil 190 is provided within the resonator cavity 172 of the fluid cooling area 170.

FIG. 2 depicts a plasma source assembly 110 having a generally conical inner surface. The configuration of the plasma source of the present invention is not restricted to a conical inner shape. For example, the plasma source assembly can be configured with a cylindrical, spherical, semi-spherical, or other shape inner surface.

In the embodiment depicted in FIG. 2, the outer shield or source housing 150 is comprised of three separate manufactured plates 152, 154, 156. The plates of the housing 150 are made from aluminum plate stock, although other metallic materials or alloy materials can alternatively be used. The plates of the housing 150 can be formed of various thickness, depending upon source size and process requirements. The plates 152, 154, 156 are machined in a manner that, when completed, they can be stacked and detachably joined or fastened together with common hardware 155 as shown. O-ring seals 158 are inserted during assembly to prevent leakage of dielectric cooling fluid. Grounding devices 159 are also inserted between respective plates during assembly. The grounding devices 159 ensure RF grounding requirements are met. The plates 152, 154, 156 are also constructed in such a manner that cooling rod-mounting features are provided where necessary. The cooling rod-mounting features can simply be through holes and/or blind counter bores as needed.

The embodiment depicted in FIG. 2 has three plates 152, 154, 156 that form the outer shield or source housing 150. The present invention can be constructed having an outer shield formed with one or two plates, or with four or more plates depending upon individual plasma source configuration requirements. However, the plates of the outer shield of the present invention do not require brazing or post machining of parts in any of these configurations. In an alternative embodiment, the outer shield or source housing 150 is formed from a rolled-ring forging as described in pending U.S. patent application Ser. No. 60/291,337 (filed on May 17, 2001).

The electrostatic shield 180 is attached to the inner diameters of the upper and lower plates of the source housing 150, thereby forming an interior wall of the resonator cavity 172. The electrostatic shield 180 has a number of slots positioned in a predetermined arrangement. The electrostatic shield 180 is attached to the cavity 172 using common hardware. Grounding features can be utilized with the electrostatic shield 180 if desired. The electrostatic shield 180 is preferably made from aluminum alloy sheet stock, however alternative materials may be used and/or the electrostatic shield 180 can be plated with other metallic materials. The use of an electrostatic shield reduces the capacitive coupling, thereby reducing the plasma potential and, hence, permitting independent control of the ion density and the ion energy. The ion density and the ion energy can be independently controlled by adjusting the power to the coil and the power to the substrate bias, respectively. Some capacitive coupling is desired in order to improve the plasma starting characteristics.

The plasma source assembly 110 depicted in FIG. 2 includes a plenum cooling plate 200, which is detachably mounted to an upper surface of the outer shield 150 whereby the gas inject assembly 140 and the electrostatic shield 180 are secured when the outer shield 150 is attached to the process chamber 120. The plenum cooling plate 200 functions as a manifold that circulates cooling fluid, which is preferably a dielectric fluid, to cool the source resonator cavity 172 and the gas inject assembly 140. The plenum cooling plate includes appropriate seals and grounding features. A viewing window 202 is located between the gas inject assembly 140 and plenum cooling plate 200. The window 202 has appropriate vacuum and fluid seals. A window may or may not be employed. The plenum cooling plate 200 is preferably made from aluminum alloy plate stock, however other alternative materials can be used.

Figure 3:
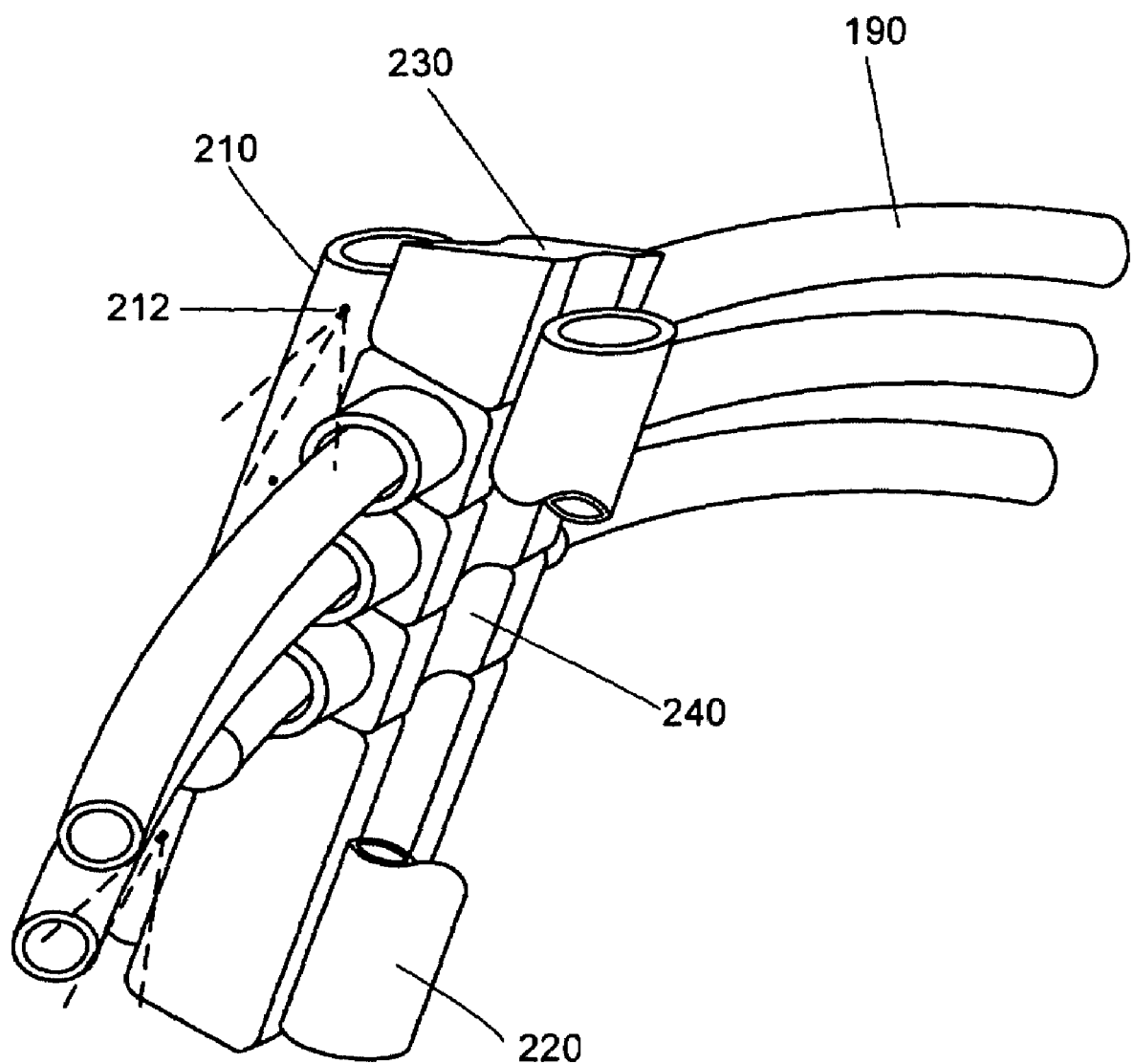
FIG. 3 is a perspective view of an assembly including a helical coil, cooling rods, and spacers according to the present invention.

The plenum cooling plate 200 supplies cooling fluid to one or more supply cooling rods 210 located radially outside the helical coil 190 in the resonator cavity 172, as depicted in FIGS. 2 and 3. The plenum cooling plate 200 has a supply inlet 204 that receives cool dielectric cooling fluid and transfers the fluid via a supply chamber 205 to the various supply cooling rods 210 distributed about the resonator cavity 172. The supply cooling rods 210 have holes 212 in sidewalls located so fluid is forced in a circumferential direction inside the resonator cavity 172, as generally depicted using dashed lines in FIG. 3.

The plenum cooling plate 200 receives cooling fluid from one or more return cooling rods 220 located radially inside the helical coil 190 in the resonator cavity 172, as depicted in FIGS. 2 and 3. Cooling fluid is returned through the bottom of each tube 220 (depicted with a section removed in FIG. 3), each exiting to a return chamber 207. Chamber 207 is connected to a return outlet 206 of the plasma cooling plate 200.

Cooling fluid also returns to the return chamber 207 through several holes or return openings 209 in an uppermost part of the resonator cavity 172. Air bubbles naturally rise to the highest portions of the resonator cavity 172 as they are circulated by the dielectric cooling fluid. As the bubbles reach the uppermost part of the resonator cavity 172, the bubbles proceed through holes 209 connecting the resonator cavity 172 with the return chamber 207 in the plenum cooling plate 200. Cooling fluid containing the bubbles is then channeled to the gas inject assembly 140 via circulation chambers 208 prior to exiting the plasma source assembly 110 via the return outlet 206 and returning to a remote fluid cooling assembly, where the bubbles are collected and removed. Higher power settings are possible for plasma generated when air bubbles are removed from the resonator cavity 172, thereby resulting in faster etching times.

The cooling rods 210, 220 are arranged as depicted in FIGS. 2–5 to lock coil insulators 240 and insulating spacers 230 securely in place, and hold the helical coil 190 in a predetermined position based on its frequency-based tuning. The helical coil 190 extends through the coil insulators 240, which maintain proper spacing of the helical coil 190. The coil insulators 240 are stacked between insulating spacers 230. The insulating spacers 230 maintain proper spacing between the cooling rods 210, 220, and maintain the location of the coil insulators 240. The cooling rods 210, 220, coil insulators 240, and coil spacers 230 are preferably made of dielectric material such as Teflon, Rexolite, or other similar dielectric or ceramic material.

The gas inject assembly 140 is retained between the plenum cooling plate 200 and the dielectric chamber wall 160. Fasteners 142 near a center of the gas inject assembly 140 retain the assembly 140 to the plenum cooling plate 200. Other fasteners 142, located on the outer periphery of the plenum cooling plate 200, attach the plenum cooling plate 200 to the uppermost plate 156 of the cavity. The fasteners 142 are preferably removable by hand, thereby requiring no tools to retain the gas inject assembly 140. Process gas is supplied to a gas plenum area 144, and from the gas plenum area 144 the gas is manifolded to a multitude of gas inject holes 146 located on a lower surface of the gas inject assembly 140. The gas inject assembly 140 is preferably made from aluminum alloy plate stock, and can be subsequently processed using, for example, an anodization process. Alternatively, the gas inject assembly 140 can be formed using other materials and surface treatments.

Figure 4:
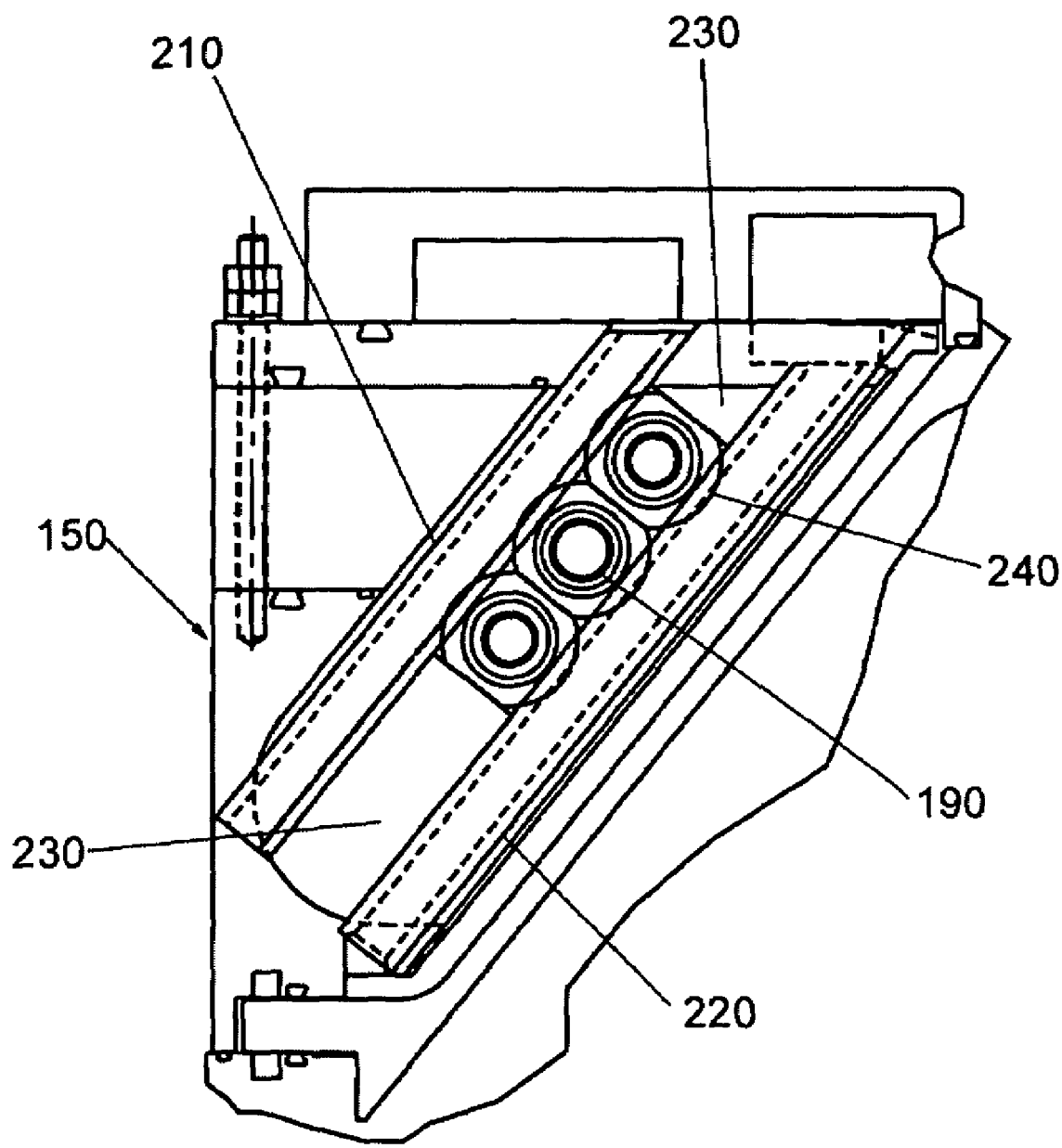
FIG. 4 is a side view of an assembly including a helical coil, cooling rods, and spacers according to the present invention.
Figure 5:
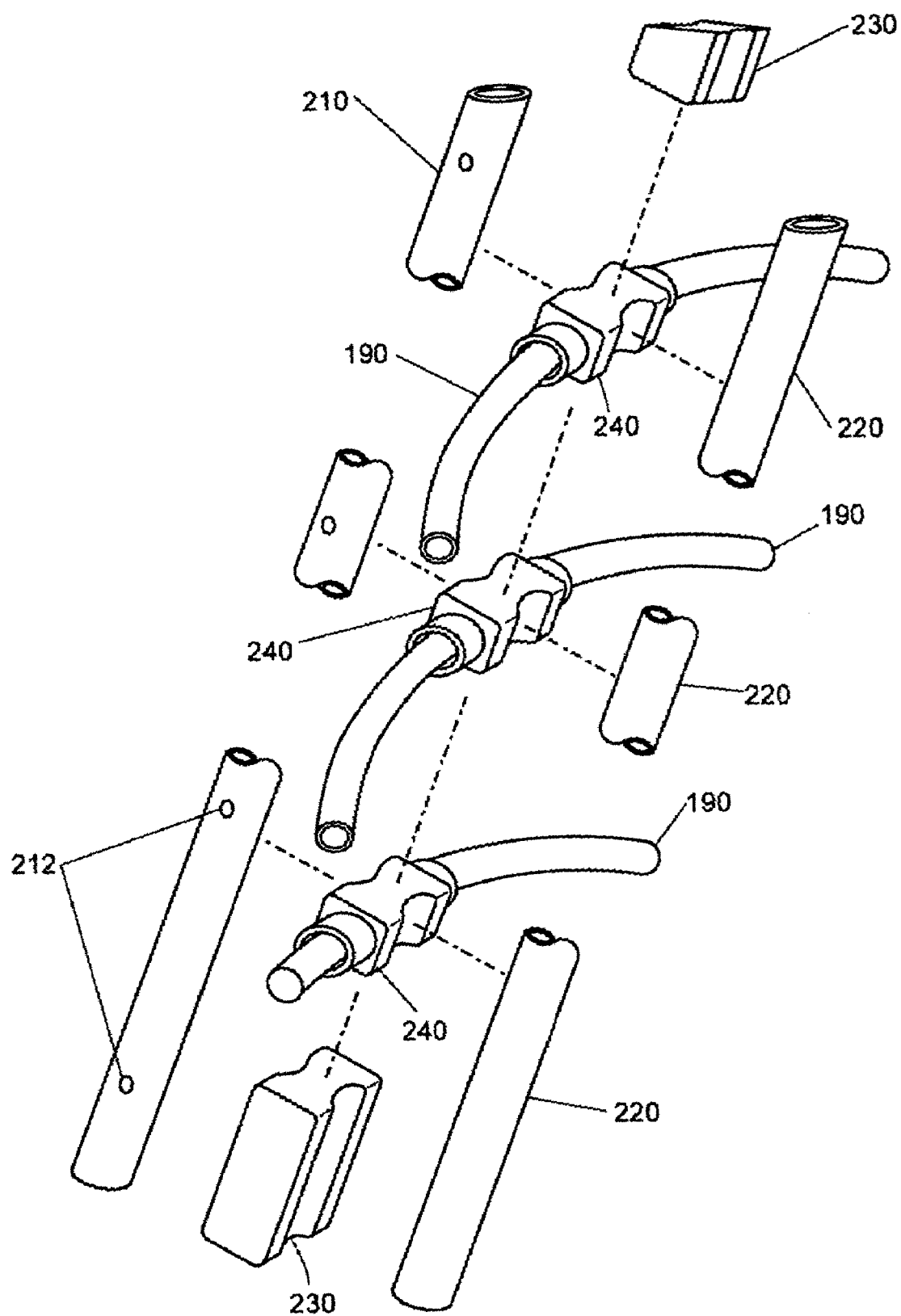
FIG. 5 is an exploded view of an assembly including a helical coil, cooling rods, and spacers according to the present invention.

FIGS. 2, 3, 4 and 5 depict a helical coil 190. FIGS. 3 through 5 depict coil insulator geometry and locking features of insulators, spacers and cooling rods. The coil insulators 240 of the spacer 230 interlock with the cooling rods 210, 220 and space the turns of the helical coil 190 at a correct distance from each other as required by a particular process and design considerations in order to achieve a desired resonance frequency. An upper end of the coil 190 is affixed to the cavity 172. The method used to attach the upper end of the coil 190 to the resonator cavity 172 can be mechanical, soldered, or welded, dependant on materials used and functional requirements present in the design. In a preferred method, the helical coil 190 is attached to a brass plug using a low temperature soldering method. Prior to the low temperature soldering step, the brass plug is soldered to the resonator cavity 172 using a high temperature soldering method. The soldering process described above provides advantageous grounding of the helical coil 190 to the resonator cavity 172. At a lower end of coil 190 opposite the upper end, the helical coil is electrically open. At the lower end, the helical coil 190 is terminated in a rounded tip, which includes a port through to an inside of the helical coil 190. Cooling fluid is forced through the inside of the helical coil 190 from the supply inlet via a supply chamber 205 of the plenum cooling plate 200. Fluid exits the coil 190 through the tip and mixes with cooling fluid already circulating in the resonator cavity 172. A tap 196 intersects the helical coil 190 at a location along the coil 190. The tap 196 is a connection to an external Fast Match Assembly (FMA). The Fast Match Assembly (not shown) comprises an impedance match network for matching the output impedance of a RF generator (not shown) to the input impedance of the plasma source and plasma. The FMA incorporates automatic control hardware and software for adjusting the impedance match according to changes in the load (plasma) impedance. Impedance match network design and the control thereof for plasma processing operations are well known to those skilled in the art of plasma source design and RF (radio frequency) electronics. Appropriate insulators and seals are positioned as required to facilitate the connection of the tap to the FMA at interface 241. The helical coil 190 is preferably made from copper tubing, however alternative materials can be utilized. The helical coil 190 may or may not be plated with some other metallic material. For example, as described above, helical coil 190, configured to have a grounded end, an open end opposite the grounded end and a tap location between the open end and the grounded end, can be designed as a quarter wave or half wave resonator. Helical resonators are well known to those of skill in the art of plasma source design. In an alternate embodiment, coil 190 comprises a tap location at a first end of coil 190 and a grounded end at a second end of coil 190.

The dielectric chamber wall or process tube 160 is installed in the assembly as depicted in FIG. 2. Appropriate seals 162, 166, 173, 174 and load bearing spacers 164, 168, 171 are utilized to secure the process tube 160 in a correct position. The seals 162, 166, 173, 174 and load bearing spacers 164, 168, 171 can be configured as described in U.S. application Ser. No. 60/256,330, which is incorporated herein by reference, or can be positioned as separate parts as depicted in FIG. 2. The outer rim of the process tube 160 has at least one dielectric pin 169 installed on the outer surface, protruding through the outer shield or housing 150. The dielectric pin(s) 169 retain the process tube 160 in position as the plasma source is rotated on hinges from the process chamber 120 opening during maintenance events. The dielectric pin(s) 169 are made from Teflon or other dielectric material and are removed, by hand, to facilitate removal of the dielectric chamber wall 160 when maintenance is necessary. The absence of mechanical fasteners or other parts other than dielectric pins allows for very fast removal and replacement of the dielectric chamber wall 160 when process requirements deem a maintenance event necessary.

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

What is new and desired to be secured by Letters Patent of the United States is:

1. A plasma source assembly comprising:
    an outer shield;
    a dielectric chamber wall;
    a helical coil provided between said outer shield and said dielectric chamber wall;
    a coil insulator coupled to at least one coil turn of said helical coil and between adjacent coil turns of said helical coil; and
    a cooling rod coupled to the coil insulator to hold the coil insulator and said at least one coil turn in a predetermined position thereby facilitating repeatable performance of said helical coil.

2. The plasma source assembly according to claim 1, wherein said outer shield comprises a plurality of plates.

3. The plasma source assembly according to claim 1, further comprising means for tuning said helical coil to a predetermined frequency.

4. The plasma source assembly according to claim 1, wherein said dielectric chamber wall and said outer shield define a resonator cavity, and wherein said helical coil is provided within said resonator cavity.

5. The plasma source assembly according to claim 4, further comprising:
    means for circulating cooling fluid throughout said resonator cavity.

6. The plasma source assembly according to claim 4, further comprising a plenum cooling plate defining a manifold configured to supply cooling fluid to said resonator cavity.

7. The plasma source assembly according to claim 6, further comprising means for removing bubbles from the cooling fluid, wherein:
    said helical coil has an upper end affixed to said resonator cavity and open to a supply side of said plenum cooling plate; and
    an upper part of said resonator cavity has a return opening configured to return the cooling fluid to a return chamber of said plenum cooling plate.

8. The plasma source assembly according to claim 6, wherein said cooling rod is a first cooling rod said plenum cooling plate is configured to supply cooling fluid to said first cooling rod provided within said resonator cavity.

9. The plasma source assembly according to claim 8, wherein:
    said first cooling rod is provided radially outside said helical coil; and
    said first cooling rod has at least one outlet hole configured to discharge the cooling fluid in a circumferential direction within said resonator cavity.

10. The plasma source assembly according to claim 8, wherein said plenum cooling plate is configured to receive cooling fluid from a second cooling rod provided within said resonator cavity.

11. The plasma source assembly according to claim 10, wherein:
    said second cooling rod is provided radially inside said helical coil; and
    said second cooling rod has at least one inlet hole configured to receive the cooling fluid from within said resonator cavity.

12. The plasma source assembly according to claim 10, further comprising a spacer provided between said first cooling rod and said second cooling rod.

13. The plasma source assembly according to claim 12, further comprising other coil insulators abutting said spacer and provided between said first cooling rod and said second cooling rod, wherein said coil insulator and other coil insulators have holes configured to receive said helical coil.

14. A plasma source comprising:
    an outer shield;
    a dielectric chamber wall coupled to said outer shield to form a resonator cavity;
    a helical coil provided within said resonator cavity; and
    a plurality of cooling rods configured to circulate cooling fluid throughout said resonator, said cooling rods being coupled to said helical coil to hold the helical coil in a predetermined position.

15. The plasma source of claim 14, wherein said helical coil comprises a plurality of coil turns, the plasma source further comprising a plurality of coil insulators each provided on said a different coil turn of said helical coil.

16. The plasma source of claim 15 wherein said plurality of coil insulators are aligned in a row and in contact so as to provide predetermined spacing between the coil turns.

17. The plasma source of claim 16, wherein each of said coil insulators includes an alignment groove and one of said cooling rods fits within the alignment grooves to align the coil insulators.

* * * * *